(12) United States Patent
Park et al.

(10) Patent No.: US 11,495,453 B2
(45) Date of Patent: Nov. 8, 2022

(54) VAPOR DEPOSITION PRECURSOR HAVING EXCELLENT THERMAL STABILITY AND REACTIVITY AND PREPARING METHOD THEREFOR

(71) Applicant: Hansol Chemical Co., Ltd., Seoul (KR)

(72) Inventors: Jung Woo Park, Seoul (KR); Jang-Hyeon Seok, Sejong-si (KR); Hyo-Suk Kim, Jeollabuk-do (KR); Min-Sung Park, Daejeon (KR)

(73) Assignee: HANSOL CHEMICAL CO., LTD., Seoul (KR)

( * ) Notice: Subject to any disclaimer, the term of this patent is extended or adjusted under 35 U.S.C. 154(b) by 281 days.

(21) Appl. No.: 16/648,096

(22) PCT Filed: Apr. 27, 2018

(86) PCT No.: PCT/KR2018/004929
§ 371 (c)(1),
(2) Date: Mar. 17, 2020

(87) PCT Pub. No.: WO2019/066179
PCT Pub. Date: Apr. 4, 2019

(65) Prior Publication Data
US 2020/0266056 A1 Aug. 20, 2020

(30) Foreign Application Priority Data
Sep. 26, 2017 (KR) .................. 10-2017-0123967

(51) Int. Cl.
*H01L 21/02* (2006.01)
*C23C 16/455* (2006.01)
(Continued)

(52) U.S. Cl.
CPC ........ *H01L 21/02205* (2013.01); *C07F 15/04* (2013.01); *C07F 15/06* (2013.01);
(Continued)

(58) Field of Classification Search
None
See application file for complete search history.

(56) References Cited

U.S. PATENT DOCUMENTS 6,103,459 A 8/2000 Diel
9,353,437 B2 5/2016 Han
(Continued)

FOREIGN PATENT DOCUMENTS

CN 103298971 A 9/2013
WO 2017099718 A1 6/2017

OTHER PUBLICATIONS

STN Registry, CAN Registry #:255885-24-6.
(Continued)

*Primary Examiner* — Asok K Sarkar
(74) *Attorney, Agent, or Firm* — Venable LLP

(57) ABSTRACT

The present invention relates to a vapor deposition compound enabling thin-film deposition through vapor deposition, and particularly to nickel and cobalt precursors capable of being applied to atomic layer deposition (ALD) or chemical vapor deposition (CVD) and having superior thermal stability and reactivity, and a method of preparing the same.

6 Claims, 2 Drawing Sheets

(51) Int. Cl.
*C07F 15/04* (2006.01)
*C07F 15/06* (2006.01)
*C23C 16/18* (2006.01)

(52) U.S. Cl.
CPC ........ *C23C 16/18* (2013.01); *C23C 16/45553* (2013.01); *H01L 21/0228* (2013.01); *H01L 21/02175* (2013.01)

(56) References Cited

U.S. PATENT DOCUMENTS

| 2013/0164456 A1 | 6/2013 | Winter et al. |
| 2013/0251903 A1 | 9/2013 | Han |
| 2014/0242298 A1* | 8/2014 | Lansalot-Matras ......................... H01L 21/28518 427/255.28 |
| 2016/0273106 A1 | 9/2016 | Kanjolia et al. |

OTHER PUBLICATIONS

Pugh, T., et al., "Colbat(III) Diazabutadien Precursors for Metal Deposition: Nanoparticle and Thin Film Growth", Inorganic Chemistry (2013).

Woo et al.,"The influence of electronic and steric factors on chain branching in ethylene polymerization by Brookharttype Ni(II) diimine catalysts: a combined density functional theory and molecular mechanics study", Journal of Drganometallic Chemistry, vol. 591, pp. 204-213 (1999).

* cited by examiner

VAPOR DEPOSITION PRECURSOR HAVING EXCELLENT THERMAL STABILITY AND REACTIVITY AND PREPARING METHOD THEREFOR

The present application is a national-stage entry under 35 U.S.C. § 371 of International Patent Application No. PCT/KR2018/004929, published as WO 2019/066179A1, filed Apr. 27, 2018, which claims priority to Korean Patent Application No. 10-2017-0123967, filed Sep. 26, 2017, the entire disclosure of each of which is incorporated by reference herein.

TECHNICAL FIELD

The present invention relates to a vapor deposition compound enabling thin-film deposition through vapor deposition, and particularly to nickel and cobalt precursors capable of being applied to atomic layer deposition (ALD) or chemical vapor deposition (CVD) and having superior thermal stability and reactivity, and a method of preparing the same.

BACKGROUND ART

In an atomic layer deposition (ALD) process or a chemical vapor deposition (CVD) process of forming an insulating film or a conductive thin film through a surface reaction using a precursor on a wafer, the selection of an appropriate precursor is regarded as very important, along with the process apparatus.

However, the development of organometallic precursors using nickel (Ni) or cobalt (Co) as a central metal and having a melting point, boiling point, volatility, viscosity and thermal stability suitable for vapor deposition is currently insufficient. Specifically, commonly used alkoxide-based ligands exhibit a very low thin-film growth rate due to the low reactivity with oxidative reaction gases ($H_2O$, $O_2$, $O_3$, etc.), and amido-based ligands may cause thermal decomposition at high temperatures of 200° C. or more due to the reactivity of the central metal with the alkyl group. Moreover, β-diketonate-based ligands have low volatility, diamino-based ligands exhibit a low ligand dissociation rate because of interaction with the reaction gas due to the chelating structure, and amino-alcohol-based ligands have drawbacks of reduced volatility and raised melting point. Alkyl- and aryl-based ligands are also poor in thermal stability. When introducing amidinate or amide ligands, the volatility of organometallic precursors is insufficient, and when introducing cyclopentadienyl ligands, the amount of impurities in a thin film deposited using the organometallic precursor is increased.

There is thus required to develop a novel organometallic precursor capable of being utilized in a variety of industrial fields, such as those of fuel cells, sensors and secondary batteries, by designing and introducing a new type of ligand.

Meanwhile, the related literature includes [Thomas Pugh, Samuel D. Cosham, Jeff A. Hamilton, Andrew J. Kingsley, and Andrew L. Johnson, "Cobalt(III) Diazabutadiene Precursors for Metal Deposition: Nanoparticle and Thin Film Growth", Inorganic Chemistry, 2013], which discloses a precursor including cobalt metal and a diazabutadiene ligand for use in a vapor deposition process, but the structure thereof differs from that of the compound of the present invention.

SUMMARY OF THE INVENTION

Accordingly, the present invention is intended to provide novel vapor deposition nickel and cobalt compounds capable of being applied to atomic layer deposition (ALD) or chemical vapor deposition (CVD).

In particular, an objective of the present invention is to provide nickel and cobalt compounds that have superior thermal stability, prevent side reactions from occurring during processing by virtue of the lower incidence of residue, and are favorable for vapor deposition because of the low viscosity and vaporization rate, a precursor including the same, and a preparation method thereof.

However, the objectives of the present invention are not limited to the foregoing, and other objectives not mentioned herein may be clearly understood by those skilled in the art through the following description.

DETAILED DESCRIPTION

An aspect of the present invention provides a compound represented by Chemical Formula 1 below:

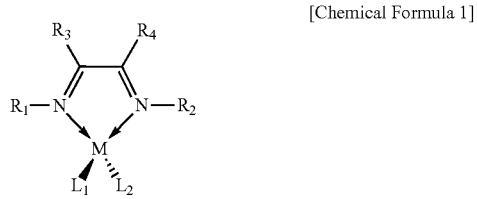

[Chemical Formula 1]

in Chemical Formula 1,

M is any one selected from among Ni and Co, $R_1$ and $R_2$ are each independently hydrogen, a substituted or unsubstituted C1-C6 linear or branched saturated or unsaturated alkyl group or isomers thereof, $R_3$ and $R_4$ are a substituted or unsubstituted C1-C4 linear or branched saturated or unsaturated alkyl group or isomers thereof, $L_1$ and $L_2$ are a substituted or unsubstituted C1-C6 linear or branched saturated or unsaturated alkyl group, $NR_5R_6$ dialkylamide, $NHR_7$ monoalkylamide, $OR_8$ alkoxide or isomers thereof, and $R_5$ to $R_8$ are a substituted or unsubstituted C1-C6 linear or branched saturated or unsaturated alkyl group or isomers thereof.

Another aspect of the present invention provides a vapor deposition precursor including the above compound.

Still another aspect of the present invention provides a thin film deposited using the vapor deposition precursor.

Yet another aspect of the present invention provides a method of manufacturing a thin film, including introducing the vapor deposition precursor into a chamber.

A further aspect of the present invention provides a multilayer thin film including at least one thin film described above.

Still a further aspect of the present invention provides a memory device including at least one thin film described above.

According to the present invention, a novel vapor deposition nickel compound or cobalt compound and a precursor including the vapor deposition compound are superior in view of thermal stability, thus enabling thin-film deposition at high temperatures and preventing side reactions from occurring during processing by virtue of the lower incidence of residue attributable to heat loss.

Moreover, the vapor deposition precursor of the present invention has low viscosity and a low vaporization rate, thus enabling uniform thin-film deposition, thereby making it possible to attain superior thin-film properties, thickness and step coverage.

These properties make it possible to provide a precursor suitable for atomic layer deposition and chemical vapor deposition and contribute to superior thin-film characteristics.

BEST MODE

Figure 1:
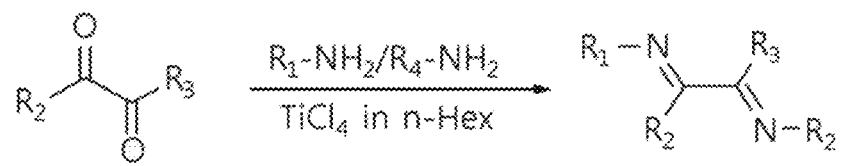
FIG. 1 schematically shows the synthesis of the ligand of Example 1.

Hereinafter, embodiments and examples of the present invention will be described in detail with reference to the accompanying drawings so that those skilled in the art can easily carry out the present invention. However, the present invention may be modified in a variety of different forms, and is not limited to the embodiments and examples herein. In order to clearly illustrate the present invention, parts not related to the description are omitted from the drawings.

As used throughout this specification, when any part is said to "comprise" or "include" any element, this means that other elements are not necessarily excluded, but may be further included unless otherwise stated.

As used throughout this specification, the term "step to" or "step of" does not mean "step for".

Also, as used throughout this specification, Me means a methyl group, Et means an ethyl group, and $^i$Pr means an isopropyl group.

Below is a detailed description of embodiments and examples of the present invention, made with reference to the accompanying drawings. However, the present invention is not limited to these embodiments and examples and drawings.

An aspect of the present invention pertains to a compound represented by Chemical Formula 1 below:

[Chemical Formula 1]

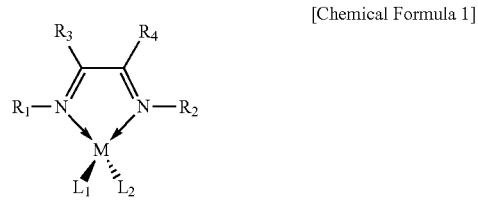

in Chemical Formula 1,

M is any one selected from among Ni and Co, $R_1$ and $R_2$ are each independently hydrogen, a substituted or unsubstituted C1-C6 linear or branched saturated or unsaturated alkyl group or isomers thereof, $R_3$ and $R_4$ are a substituted or unsubstituted C1-C4 linear or branched saturated or unsaturated alkyl group or isomers thereof, $L_1$ and $L_2$ are a substituted or unsubstituted C1-C6 linear or branched saturated or unsaturated alkyl group, $NR_5R_6$ dialkylamide, $NHR_7$ monoalkylamide, $OR_8$ alkoxide or isomers thereof, and $R_5$ to $R_8$ are a substituted or unsubstituted C1-C6 linear or branched saturated or unsaturated alkyl group or isomers thereof.

In an embodiment of the present invention, the compound represented by Chemical Formula 1 is preferably represented by any one of the following Chemical Formulas:

[Chemical Formula 1-1]

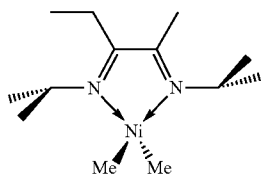

[Chemical Formula 1-2]

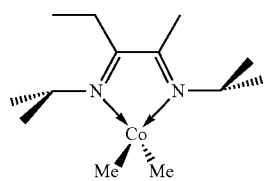

The compound of [Chemical Formula 1-1] is Ni[$^i$Pr$_2$-Et, MeDAD][Me]$_2$, and the compound of [Chemical Formula 1-2] is Co[$^i$Pr$_2$-Et, MeDAD][Me]$_2$. Here, Me is a methyl group, Et is an ethyl group, and $^i$Pr is an isopropyl group.

In an embodiment of the present invention, the compound of Chemical Formula 1 may be volatile or liquid at room temperature. In atomic layer deposition (ALD), reactants have to be highly volatile, stable, and highly reactive. In atomic layer deposition (ALD), a thin film of a monolayer or less grows through a surface reaction during a cycle of deposition in a manner in which reaction feeds are supplied separately, and ligands of the reaction feeds adsorbed on the substrate are removed through a chemical reaction with other reaction feeds that are subsequently supplied. When the precursor compound, which is a reactant, is heated for atomic layer deposition, it is favorable for the precursor compound to be in a liquid phase rather than in a solid phase in view of reaction rate and processing.

Another aspect of the present invention pertains to a vapor deposition precursor including the above compound.

In an embodiment of the present invention, the vapor deposition may include atomic layer deposition (ALD) or chemical vapor deposition (CVD), and the chemical vapor deposition may include metal organic chemical vapor deposition (MOCVD).

Still another aspect of the present invention pertains to a thin film deposited using the vapor deposition precursor.

Yet another aspect of the present invention pertains to a method of manufacturing a thin film, including introducing the vapor deposition precursor into a chamber. The introducing the vapor deposition precursor into the chamber may include physical adsorption, chemical adsorption, or physical and chemical adsorption.

In an embodiment of the present invention, the method may further include dissolving the vapor deposition precursor in an organic solvent in order to supply the vapor deposition precursor. In vapor deposition, a precursor, that is, a source gas, may be provided in the form of lowering the viscosity via a solution delivery device using an organic solvent as a diluent for efficiency of movement and injection into a deposition chamber into which the substrate is introduced.

In an embodiment of the present invention, the method of manufacturing the thin film may include atomic layer deposition (ALD) or chemical vapor deposition (CVD), and the chemical vapor deposition may include metal organic chemical vapor deposition (MOCVD).

A further aspect of the present invention pertains to a multilayer thin film including at least one thin film described above.

Still a further aspect of the present invention pertains to a memory device including at least one thin film described above.

A better understanding of the present invention will be given through the following examples, which are not to be construed as limiting the present invention.

MODE FOR INVENTION

Example 1

Preparation of Diazadiene (DAD) Ligand 25 g (0.25 mol) of 2,3-pentanedione was dissolved in 600 mL of hexane and then cooled to about −20° C. The cooled solution was slowly added with 429 mL (5.0 mol) of $^{i}$Pr-NH$_2$, then slowly added with 33 mL (0.30 mol) of TiCl$_4$, and stirred. After complete addition of TiCl$_4$, the resulting solution was gradually warmed to room temperature and further stirred at room temperature for 24 hr. The reaction solution was filtered, and the filtrate was depressurized to thus remove all of the solvent and volatile impurities. The liquid thus obtained was purified at 40° C. under 0.4 torr, thereby yielding a DAD ligand (18 g, 40%) as a clear liquid (FIG. 1).

Example 2

Preparation of Ni(DAD)Me$_2$ Precursor 15 g (0.063 mol) of NiCl$_2$.6H$_2$O was dissolved in 594 mL (7.4 mol) of pyridine and then heated with stirring at 120° C. for 3 hr. After termination of the reaction, filtration under reduced pressure was performed to afford a sky-blue solid, which was then dried at room temperature for 24 hr. 26 g (0.058 mol) of NiCl$_2$(py)$_4$ and 2 mL of pyridine were dissolved in 100 mL of Et$_2$O and then cooled to −60° C. The resulting solution was slowly added dropwise with 73 mL (0.12 mol) of MeLi, gradually warmed to room temperature, and stirred for about 2 hr. After termination of the reaction of the solution, the volatile solvent was removed under reduced pressure.

Figure 2:
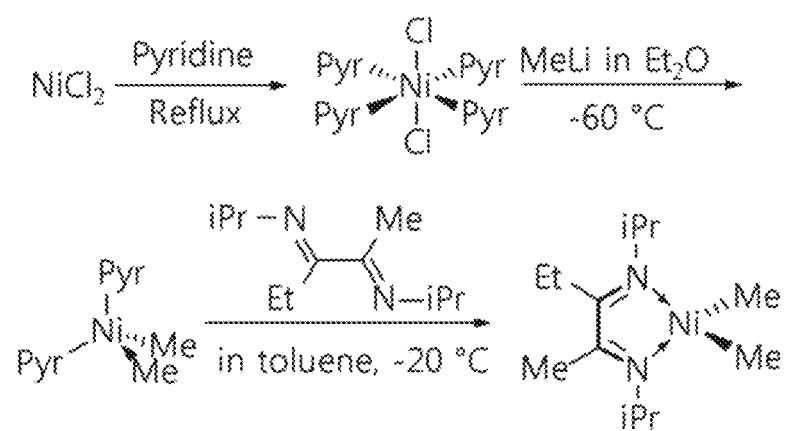
FIG. 2 schematically shows the synthesis of the precursor of Example 2.

After dilution in toluene, addition to the above solution from which the volatile solvent was removed, and removal of byproducts through a filter, the resulting filtrate was concentrated to approximately halve the volume thereof. Thereafter, the solution thus concentrated was cooled to −20° C., slowly added with the DAD ligand, gradually warmed to room temperature and stirred for about 1 hr. The solvent was removed under reduced pressure, thereby yielding Ni(DAD)Me$_2$ (3.7 g, 24%) as a dark red liquid compound (FIG. 2).

$^1$H-NMR (C$_6$D$_6$): δ3.35 (m, 1H),

δ2.92 (m, 1H),

δ1.90 (m, 6H),

δ0.99 (m, 2H),

δ−1.12 (s, 3H)

Example 3

A cobalt compound was added with the DAD ligand prepared in Example 1 and the reaction and preparation process as in Example 2 were carried out, thereby preparing a Co(DAD)Me$_2$ precursor.

Preparation Example 1

The organometallic precursor Ni(DAD)Me$_2$ including the organometallic compound of Chemical Formula 1 prepared in Example 2 was deposited to form a thin film using an atomic layer deposition (ALD) device. The substrate used in the present test was a p-type Si(100) wafer, and the resistance thereof was 0.02 Ω·cm. The p-type Si wafer was washed through sonication for 10 min in each of acetone, ethanol, and deionized water (DI water) before deposition. The Si wafer was immersed in a solution of 10% HF (HF:H$_2$O=1:9) for 10 sec to remove a natural oxide thin film therefrom. The Si wafer, which was washed with HF, was immediately transferred into an atomic layer deposition (ALD) chamber. Here, the organometallic precursor used in the test was a precursor including nickel, but the precursor including cobalt prepared in Example 3 may be used. The temperature was maintained at 85° C. [Ni(DAD)Me$_2$ precursor] (15 sec), [Ar] (30 sec), [O$_3$] (5 sec/8 sec/10 sec), and [Ar] (30 sec) were sequentially supplied, and the flow rate of argon (Ar) for purging was 100 sccm. Ozone (O$_3$) used as the reaction gas was allowed to flow at a flow rate of 30 sccm. Each reaction gas was fed through on/off control of a pneumatic valve, and the reactor pressure was 1 ton in the deposition temperature range of 260° C. to 340° C.

Conventional cyclopentadiene (cp) and oxide ligands are low in reactivity with the oxidative reaction gas and thus need a high-temperature condition or a highly reactive reaction gas to form a nickel oxide film (NiO$_x$ film) or a cobalt oxide film (CoO$_y$ film). Also, a nickel or cobalt alkyl complex and a cobalt or nickel diamide complex are difficult to use as a precursor because they are unstable at room temperature. The introduction of alkyl or amide ligands can improve the reactivity with oxidative reaction gases. Unlike stabilization ligands such as pyridine or phosphine, the diazadiene (DAD) ligand prepared in Example 1 of the present invention is advantageous because of the relatively high thermal stability and high oxidative reaction gas reactivity thereof. Through the introduction of the above ligand, it is possible to improve the thermal stability of the complex.

Moreover, uniform thin-film deposition becomes possible using the Ni(DAD)Me$_2$ precursor including the diazadiene (DAD) ligand, thereby attaining superior thin-film properties, thickness and step coverage.

The scope of the invention is represented by the claims below rather than the aforementioned detailed description, and all changes or modified forms that are capable of being derived from the meaning, range, and equivalent concepts of the appended claims should be construed as being included in the scope of the present invention. All of the reagents used in the present example are commercially available, and are used without specific purification unless otherwise specified.

INDUSTRIAL APPLICABILITY

The present invention pertains to a vapor deposition compound that enables thin-film deposition through vapor deposition, which is particularly useful as nickel and cobalt precursors capable of being applied to atomic layer deposition (ALD) or chemical vapor deposition (CVD) and having superior thermal stability and reactivity.

The invention claimed is:

1. A compound represented by Chemical Formula 1 below:

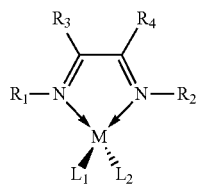

[Chemical Formula 1]

in Chemical Formula 1,

M is any one selected from among Ni and Co, $R_1$ and $R_2$ are each independently a substituted or unsubstituted C1-C6 linear or branched saturated or unsaturated alkyl group or isomers thereof, $R_3$ and $R_4$ are each independently a substituted or unsubstituted C1-C4 linear or branched saturated or unsaturated alkyl group or isomers thereof, $L_1$ and $L_2$ are a substituted or unsubstituted C1-C6 linear or branched saturated or unsaturated alkyl group, $NR_5R_6$ dialkylamide, $NHR_7$ monoalkylamide, $OR_8$ alkoxide or isomers thereof, and $R_5$ to $R_8$ are a substituted or unsubstituted C1-C6 linear or branched saturated or unsaturated alkyl group or isomers thereof.

2. The compound of claim 1, wherein the compound represented by Chemical Formula 1 is represented by any one of Chemical Formulas below:

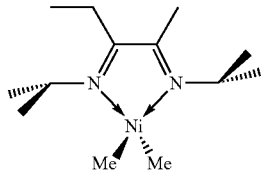

[Chemical Formula 1-1]

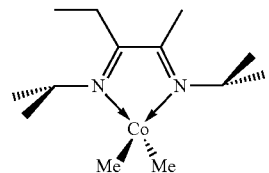

[Chemical Formula 1-2]

wherein Me is a methyl group.

3. A vapor deposition precursor comprising the compound of claim 1.

4. The vapor deposition precursor of claim 3, wherein the vapor deposition comprises atomic layer deposition (ALD) or chemical vapor deposition (CVD).

5. A method of manufacturing a thin film, comprising introducing the vapor deposition precursor of claim 3 on a substrate into a chamber.

6. The method of claim 5, wherein the method of manufacturing the thin film comprises atomic layer deposition (ALD) or chemical vapor deposition (CVD).

\* \* \* \* \*